United States Patent
Lee et al.

(10) Patent No.: US 7,368,510 B2
(45) Date of Patent: *May 6, 2008

(54) ORGANIC SEMICONDUCTOR COPOLYMERS CONTAINING OLIGOTHIOPHENE AND N-TYPE HETEROAROMATIC UNITS

(75) Inventors: Bang Lin Lee, Gyeonggi-do (KR);
Kook Min Han, Gyeonggi-do (KR);
Jung Han Shin, Gyeonggi-do (KR);
Sang Yoon Lee, Gyeonggi-do (KR);
Eun Jeong Jeong, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 429 days.

This patent is subject to a terminal disclaimer.

(21) Appl. No.: 11/073,691

(22) Filed: Mar. 8, 2005

(65) Prior Publication Data
US 2006/0006379 A1    Jan. 12, 2006

(30) Foreign Application Priority Data
Jul. 8, 2004    (KR) .................... 10-2004-0053023

(51) Int. Cl.
*C08F 8/18*    (2006.01)
*H01L 29/08*    (2006.01)
*H01L 29/02*    (2006.01)
*H01L 51/30*    (2006.01)
*H01B 1/12*    (2006.01)

(52) U.S. Cl. .................... 525/355; 525/546; 528/377; 528/427; 428/419; 257/40; 257/289; 438/99

(58) Field of Classification Search ................ 525/355, 525/540; 528/487, 377; 428/419; 257/40, 257/289; 438/99
See application file for complete search history.

(56) References Cited

U.S. PATENT DOCUMENTS

| 5,627,199 | A | 5/1997 | Booher et al. |
| 6,107,117 | A | 8/2000 | Bao et al. |
| 6,452,207 | B1 | 9/2002 | Bao |
| 7,019,327 | B2 * | 3/2006 | Lee et al. ............ 257/40 |

(Continued)

FOREIGN PATENT DOCUMENTS

WO        00/79617 A1    12/2000

OTHER PUBLICATIONS

David J. Brennan et al. "Polyfluorenes as Organic Semiconductors for Polymeric Field Effect Transistors" Mat. Res. Soc. Symp. Proc. Apr. 22-25, 2003 vol. 771, pp. 157-169, The Dow Chemical Company, Advanced Electronic Materials, Midland, Michigan, USA, 48674.

(Continued)

*Primary Examiner*—Duc Truong
(74) *Attorney, Agent, or Firm*—Buchanan Ingersoll & Rooney PC

(57) ABSTRACT

An exemplary organic semiconductor copolymer includes a polymeric repeat structure having a polythiophene structure and an electron accepting unit. The electron accepting unit has at least one electron-accepting heteroaromatic structure with at least one electron-withdrawing imine nitrogen in the heteroaromatic structure or a thiophene-arylene comprising a $C_{2-30}$ heteroaromatic structure. Methods of synthesis and electronic devices incorporating the disclosed organic semiconductors, e.g., as a channel layer, are also disclosed.

8 Claims, 8 Drawing Sheets

U.S. PATENT DOCUMENTS 7,030,409 B2 * 4/2006 Lee et al. .................. 257/40

OTHER PUBLICATIONS

Francis Garnier et al., Molecular Engineering of Organic Semiconductors: Design of Self-Assembly Properties in Conjugated Thiophene Oligomers, J. Am. Chem. Soc., Apr. 8, 1993, vol. 115, pp. 9816-8721, Laboratoire des Matériaux Moléculaires, CNRS, 2 rue Dunant, 94320 Thiais, France, and Thomson-CSF/LCR, Domaine de Corbeville, 91404 Orsay, France.

Jan Genzer et al., "Creating Long-Lived Superhydrophobic Polymer Surfaces Through Mechanically Assembled Monolayers", Science, Dec. 15, 2000, vol. 290, pp. 2123~2126.

* cited by examiner

ORGANIC SEMICONDUCTOR COPOLYMERS CONTAINING OLIGOTHIOPHENE AND N-TYPE HETEROAROMATIC UNITS

RELATED APPLICATION DATA

This application is based on and claims priority under 35 U.S.C. §119 to Korea Application No. 2004-53023, filed Jul. 8, 2004, the entire contents of which are incorporated herein by reference.

FIELD OF THE DISCLOSURE

The present disclosure generally relates to organic semiconductors. More specifically, the present disclosure relates to organic semiconductors, such as thiophene-based π-conjugated polymers, and electronics and structures incorporating organic semiconductors.

STATE OF THE ART

In the discussion of the state of the art that follows, reference is made to certain structures and/or methods. However, the following references should not be construed as an admission that these structures and/or methods constitute prior art. Applicant expressly reserves the right to demonstrate that such structures and/or methods do not qualify as prior art against the present invention.

Certain alternating single and double bond structures, also called π-conjugation, along the backbone of polymer chains can contribute to increased electron transport and charge storage in such materials. The π-conjugation can be along linear structures as well as along aromatic structures. Examples of π-conjugated polymers includes polyacetylene, polyparaphenylene, polyaniline, polypyrrole and polythiophene. Further, the appending of electron accepting and donating moieties to the π-conjugated structures can influence the electron transport and charge storage in such materials.

Organic semiconductors have been used as channel layers in organic thin film transistors (OTFT). For example, small molecular organic semiconductors and polymeric organic semiconductors have been disclosed in U.S. Pat. Nos. 6,107,117; 6,621,099; and 6,723,394; International Application Publications WO 00/79617 and WO 02/45184; and *Mat. Res. Soc. Symp. Proc.*, vol. 771, L6.1 to L6.5, 157-179 (2003); *J. Am. Chem Soc.* Vol. 115, 8716-8721 (1993); and *Science*, vol. 290, pp. 2130-2133 (2000).

SUMMARY

Exemplary embodiments of the organic semiconductors and methods of forming organic semiconductors disclosed herein are useful for electronic devices. Further, exemplary embodiments of the disclosed organic semiconductors have regioregular alternating structures including both p-type oligothiophene and n-type moieties in the main chain.

An exemplary embodiment of an organic semiconductor copolymer comprises a poly(oligothiophene-arylene) derivative having a chemical formula:

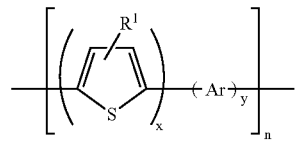

(Eq. 1)

wherein x is an integer from 3 to 12, y is an integer from 1 to 4 with x>y, $R^1$ is a hydrogen atom, a $C_{1-20}$ linear, branched, or cyclic alkyl group, a $C_{1-20}$ alkoxyalkyl group or a $C_{1-16}$ linear, branched, or cyclic alkoxy group, Ar is a $C_{2-30}$ heteroaromatic structure comprising at least one electron-withdrawing imine nitrogen atom in the heteroaromatic structure or a thiophene-arylene comprising the $C_{2-30}$ heteroaromatic structure, and n is an integer from 4 to 200.

An exemplary organic semiconductor copolymer comprises a polymeric repeat structure including a polythiophene structure and an electron accepting unit, wherein the electron accepting unit includes at least one electron-accepting heteroaromatic structure having at least one electron-withdrawing imine nitrogen atom in the heteroaromatic structure.

An exemplary embodiment of a method of preparing a poly(oligothiophene-arylene) derivative comprises adding a catalyst selected from the group consisting of Pd complexes and Ni complexes to a monomer solution, the monomer solution including a first monomer of formula 1 and a second monomer of formula 2, and preparing the poly(oligothiophene-arylene) derivative by a polycondensation reaction. Formula 1 is:

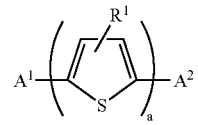

(Eq. 2)

wherein $A^1$ is a halogen atom, a trialkyltin group or a borane group, $A^2$ is a halogen atom, a trialkyltin group or a borane group, $R^1$ is a hydrogen atom, a $C_{1-20}$ linear, branched, or cyclic alkyl group, a $C_{1-20}$ alkoxyalkyl group or a $C_{1-16}$ linear, branched, or cyclic alkoxy group, and a is an integer from 1 to 10. Formula 2 is

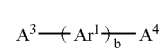

(Eq. 3)

wherein $A^3$ is a halogen atom or a trialkyltin group, $A^4$ is a halogen atom or a trialkyltin group, $Ar^1$ is $C_{2-30}$ heteroaromatic structure comprising at least one electron-withdrawing imine nitrogen atom in the heteroaromatic structure or a thiophene-arylene comprising the $C_{2-30}$ heteroaromatic structure, and b is an integer from 1 to 4.

An exemplary semiconductor multilayer structure comprises a substrate, a gate deposited on the substrate, a source and a drain, the source and the drain separated from the gate by an insulator, and a channel layer including an organic semiconductor. The organic semiconductor comprises a poly(oligothiophene-arylene) derivative having a chemical formula:

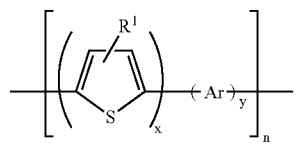

(Eq. 4)

wherein x is an integer from 3 to 12, y is an integer from 1 to 4 with x>y, $R^1$ is a hydrogen atom, a $C_{1-20}$ linear, branched, or cyclic alkyl group, a $C_{1-20}$ alkoxyalkyl group or a $C_{1-16}$ linear, branched, or cyclic alkoxy group, Ar is a $C_{2-30}$ heteroaromatic structure comprising at least one electron-withdrawing imine nitrogen atom in the heteroaromatic structure or a thiophene-arylene comprising the $C_{2-30}$ heteroaromatic structure, and n is an integer from 4 to 200.

An exemplary embodiment of a method of preparing a poly(oligothiophene-arylene) derivative comprises adding a catalyst selected from the group consisting of Pd complexes and Ni complexes to a monomer solution, the monomer solution including a first monomer and a second monomer and preparing the poly(oligothiophene-arylene) derivative by a polycondensation reaction. The first monomer is selected from the group consisting of thiophene-distannane, thiophene-diboronate, thiophene-diboronic acid and dihalothiophene. The second monomer is selected from the group consisting of a $C_{2-30}$ heteroaromatic structure comprising at least one electron-withdrawing imine nitrogen atom in the heteroaromatic structure and a $C_{2-30}$ heteroaromatic structure represented by:

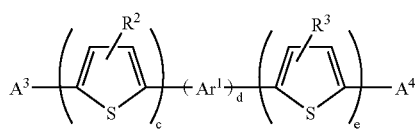

(Eq. 5)

wherein $R^2$ is a hydrogen atom, a hydroxyl group, a $C_{1-20}$ linear, branched or cyclic alkyl group, a $C_{1-20}$ alkoxyalkyl group, or a $C_{1-16}$ linear, branched or cyclic alkoxy group, $R^3$ is a hydrogen atom, a hydroxyl group, a $C_{1-20}$ linear, branched or cyclic alkyl group, a $C_{1-20}$ alkoxyalkyl group, or a $C_{1-16}$ linear, branched or cyclic alkoxy group, c is an integer from 1 to 8, d is an integer from 1 to 4, and e is an integer from 1 to 8.

BRIEF DESCRIPTION OF THE DRAWING FIGURES

The following detailed description of preferred embodiments can be read in connection with the accompanying drawings in which like numerals designate like elements and in which.

Figure 3A:
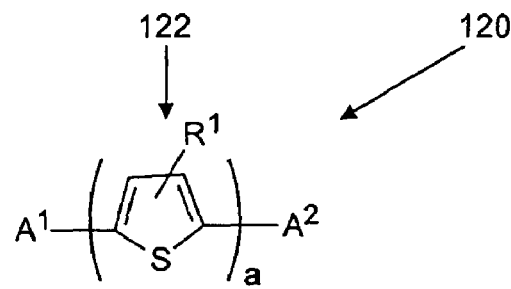
Figure 3B:
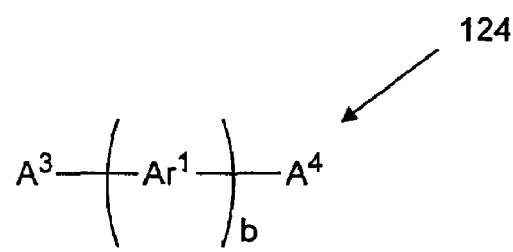
Figure 3C:
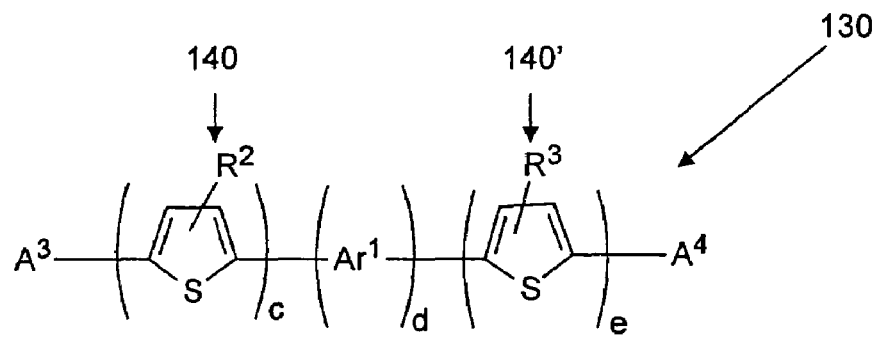

FIGS. 3A to 3C illustrate exemplary starting monomers for an exemplary embodiment of a reaction resulting in the disclosed organic semiconductor copolymer. FIG. 3A includes the thiophene moiety; FIG. 3B includes an electron accepting aromatic moiety, e.g., an n-type heteroaromatic unit; and FIG. 3C includes a thiophene-arylene.

FIG. 4 illustrates examples of a first type of electron accepting aromatic moiety.

Figure 5:
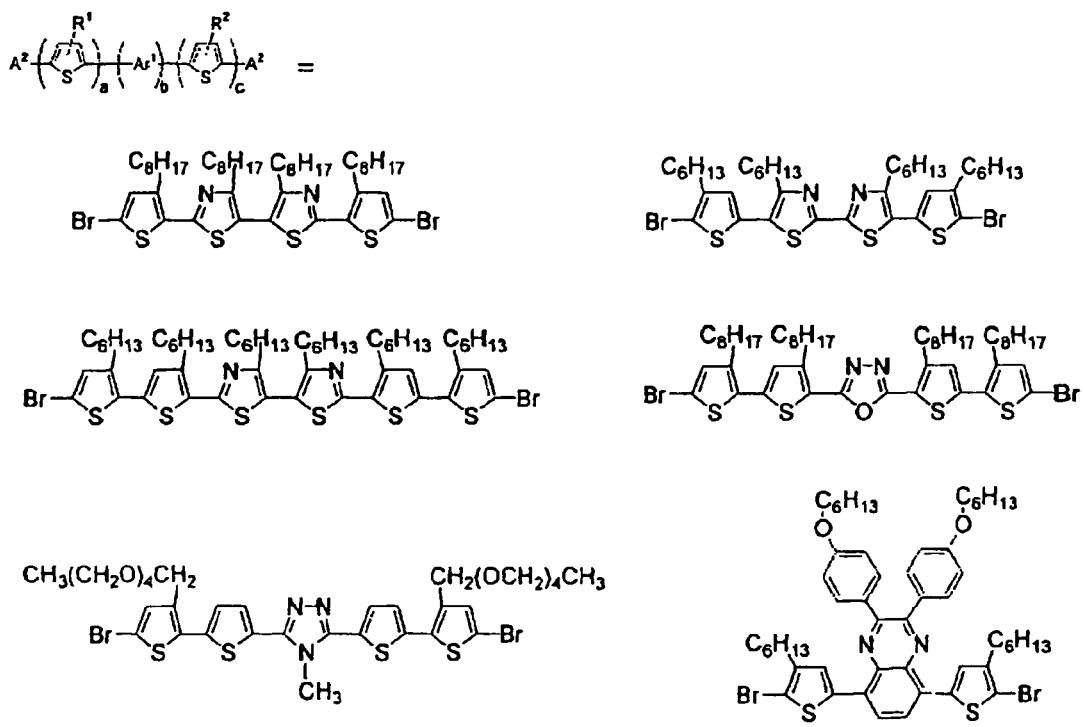

FIG. 5 illustrates examples of a second type of electron accepting aromatic moiety.

Figure 6:
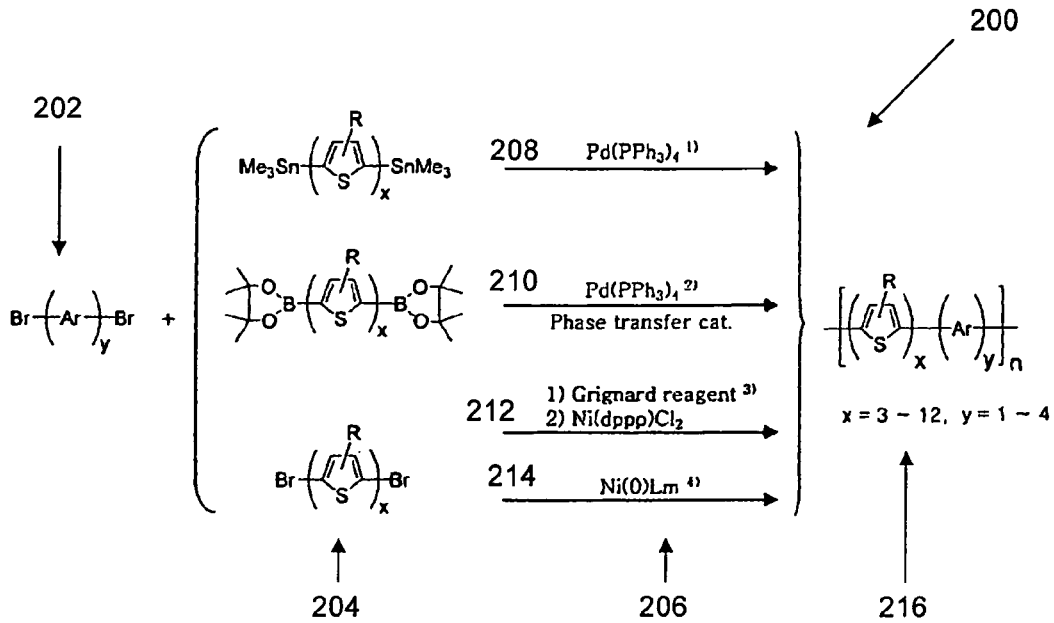

FIG. 6 illustrates a first exemplary synthesis reaction for an organic semiconductor copolymer.

Figure 7:
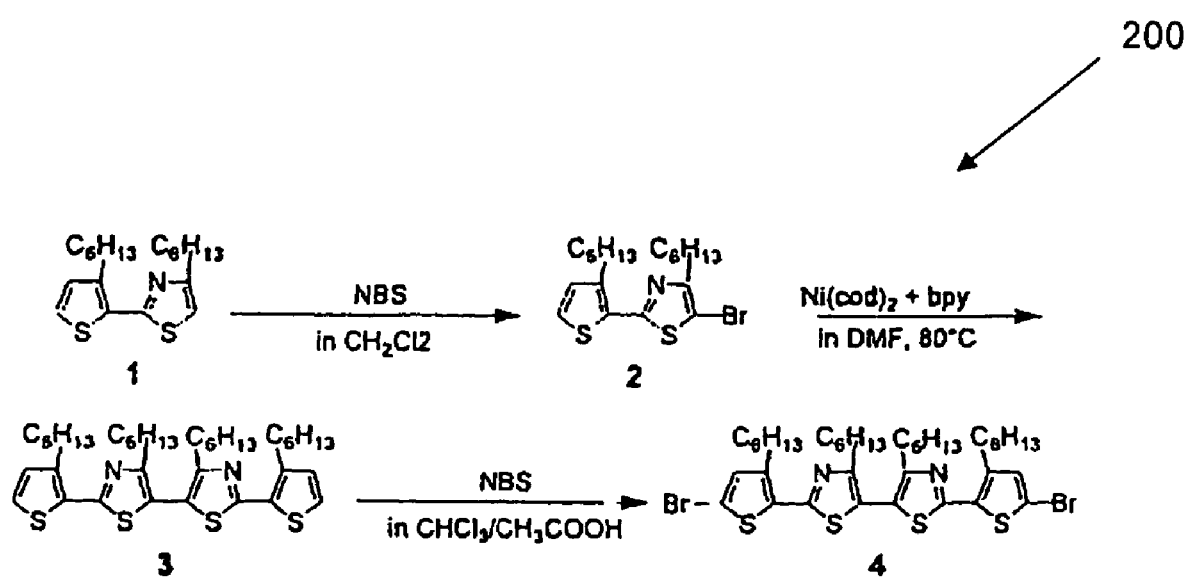

FIG. 7 illustrates an exemplary synthesis reaction for a polymer suitable for use as a starting monomer in exemplary reactions to produce an organic semiconductor copolymer.

Figure 8A:
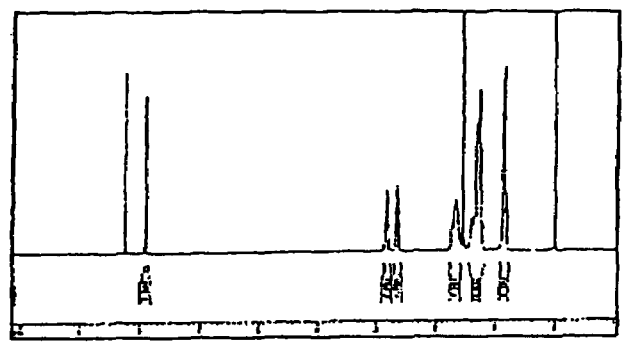
Figure 8B:
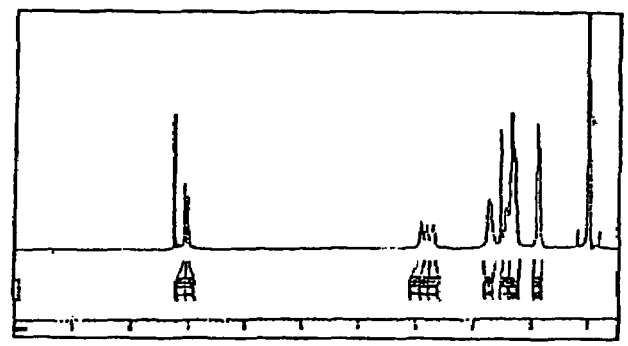
Figure 8C:
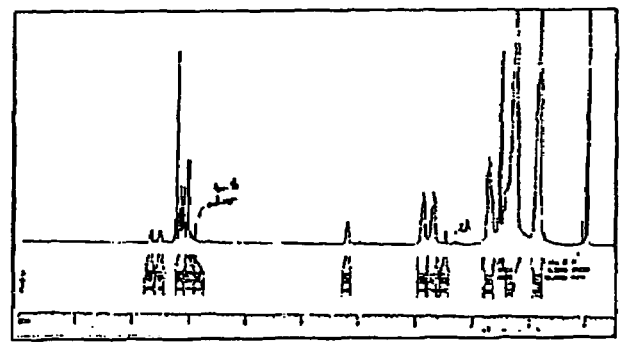

FIGS. 8A to 8C include proton NMR spectra for compound 4 in FIG. 8A and two organic semiconductor copolymers—Poly-1 (FIG. 8B) and Poly-2 (FIG. 8C).

Figure 9:
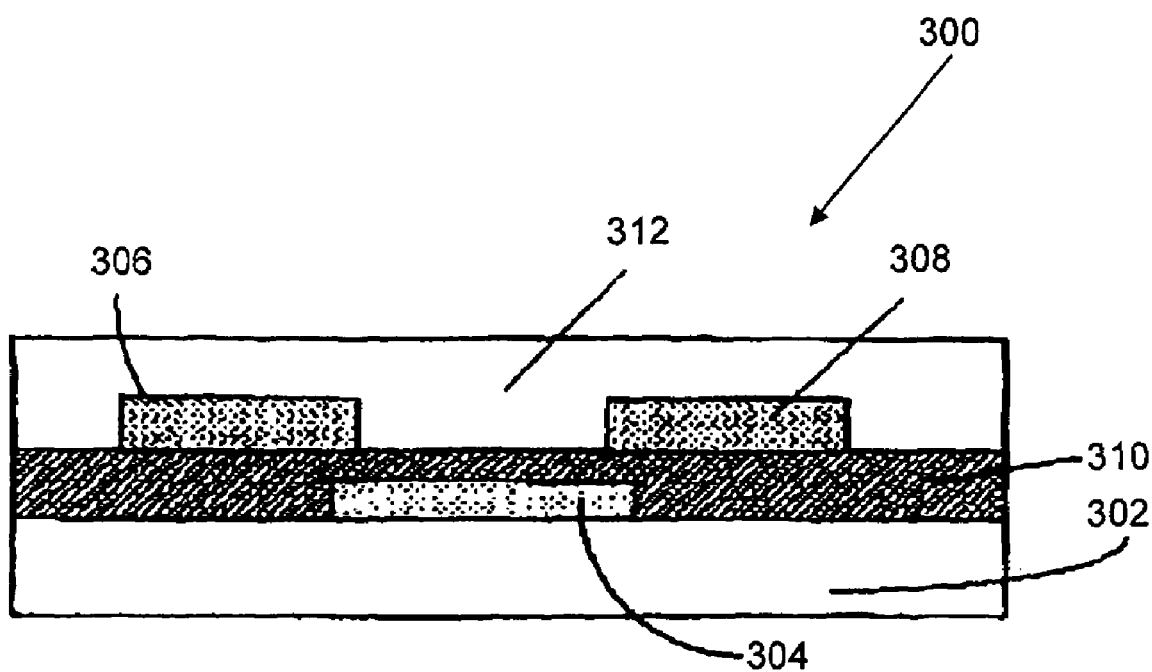

FIG. 9 schematically illustrates an exemplary embodiment of an organic thin film transistor with a channel layer formed of an organic semiconductor copolymer disclosed herein.

Figure 10A:
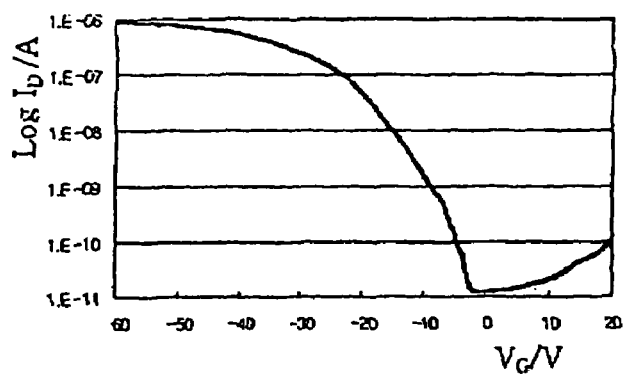
Figure 10B:
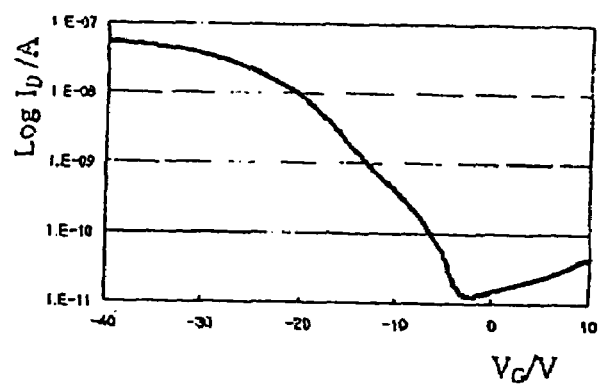
Figure 10C:
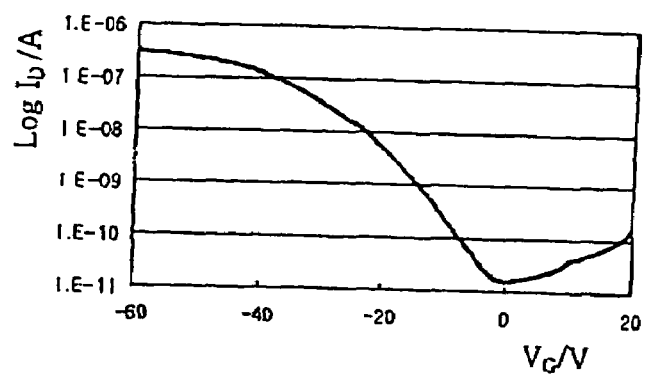

FIGS. 10A to 10C present experimentally determined source-drain current ($I_{SD}$) characteristics of organic thin film transistors with a channel layer formed of Poly-1 (FIG. 10A), Poly-2 (FIG. 10B) and Poly-3 (FIG. 10C) disclosed herein.

DETAILED DESCRIPTION

Disclosed herein are organic semiconductors and methods of forming organic semiconductors useful for electronic devices, such as for channel layer materials in organic thin film transistors (OTFT).

Figure 1:
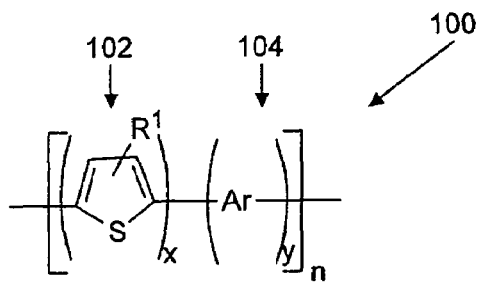
FIG. 1 illustrates a generalized chemical structure for an exemplary organic semiconductor copolymer.

FIG. 1 illustrates a generalized chemical structure 100 for an exemplary organic semiconductor copolymer. The FIG. 1 structure 100 includes a certain length of electron-donating (p-type) oligothiophene units 102 and an electron-accepting (n-type) moiety 104, which may be a linear or a ring structure.

Any length of electron-donating (p-type) oligothiophene units 102 can be in the structure 100. The number, and therefore the length, of the oligothiophene units 102 contributes to a high p-type behavior for the structure 100 and contributes to a high on-current, e.g., an on:off ratio of greater than $10^4$. P-type behavior general refers to the ability of the structure to accept positive charge and the ability to delocalize positive charge among the atoms of the structure, preferably reversible delocalize the charge. Exemplary electron-donating oligothiophene units include tetrathiophene, sexithiophene, octothiophene, and so forth.

The FIG. 1 structure 100 also includes an electron-accepting (n-type) moiety 104. N-type behavior general refers to the ability of the structure to accept negative charge and the ability to delocalize negative charge among the atoms of the structure, preferably reversibly delocalize the charge. The number, and therefore the length, of the electron-accepting moiety 104 contributes to lowering the HOMO level of the structure 100 and contributes to a low off-state current, e.g., off state current of less than $10^{-11}$ amps. Exemplary electron-accepting moieties 104 include heteroaromatic structures having at least one electron-withdrawing imine nitrogen in the heteroaromatic structure.

The FIG. 1 structure 100 preferably has a regioregular alternating structure in the polymer main chain or backbone. Regioregular character contributes to dense packing. This dense packing is also known as π-stacking. In π-stacking, the π-orbitals of the main chain of structure 100 are located to overlap π-orbitals of structures in adjacent polymer main chains. When π-orbitals overlap, electrons have higher mobility between polymer main chains, contributing to overall high electron mobility for the structure 100, e.g., greater than 0.05 cm$^2$/Vs.

In a preferred embodiment, the structure 100 is an organic semiconductor copolymer comprising a polymeric repeat structure including a polythiophene structure and an electron accepting unit, wherein the electron accepting unit includes at least one electron-accepting heteroaromatic structure having at least one electron-withdrawing imine nitrogen in the heteroaromatic structure.

The polymeric repeat structure of the exemplary organic semiconductor copolymer preferably includes at least three polythiophenes structures and up to 12 polythiophene structures. Also, the exemplary organic semiconductor copolymer includes from 1 to 4 electron-accepting heteroaromatic structures. Preferably, the electron accepting unit includes oligoarylene comprising electronic-accepting heteroaromatic structures having at least one electron-withdrawing imine nitrogen in the heteroaromatic structure. The electron-accepting heteroaromatic structure in preferred embodiments is a $C_{2-30}$ heteroaromatic structure including the at least one electron-withdrawing imine nitrogen atom in the heteroaromatic structure or, the electron-accepting heteroaromatic structure is a thiophene-arylene including the $C_{2-30}$ heteroaromatic structure.

Further, in exemplary embodiments, the polythiophene structure of the polymeric repeat structure is functionalized with a side group $R^1$. Examples of suitable side groups include a $C_{1-20}$ linear, branched, or cyclic alkyl group, a $C_{1-20}$ alkoxyalkyl group or a $C_{1-16}$ linear, branched or cyclic alkoxy group. Further, in preferred embodiments, the number of polymeric repeat structures is from 4 to about 20. In addition, the number of polythiophene structure, e.g., 3 to 12, is greater than the number of electron accepting units, e.g., 1 to 4, in the polymeric repeat structure.

The ratio of polythiophene structures to electron accepting units can vary within the limits described herein and does not have a fixed ratio. However, as the number of electron accepting units increases in the polymeric repeat unit, the steric hindrance of the polymeric repeat structure decreases. For example, the steric hindrance where the number of electron accepting units is 4 is less than the steric hindrance where the number of electron accepting units is 3 or less. Furthermore, the more electron accepting units in the polymeric repeat structure, the more positive the overall character of the organic semiconductor copolymer becomes. In addition, the number of negative moieties, e.g., the arylene portion of the polymeric repeat structure, improves electron mobility control by influencing the steric hindrance and also improves the off-current.

An exemplary embodiment of an organic semiconductor copolymer comprises a poly(oligothiphene-arylene) derivative having a chemical formula:

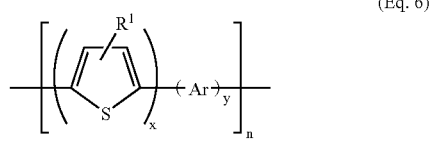

(Eq. 6)

wherein x is an integer from 3 to 12, y is an integer from 1 to 4 with x greater than y, $R^1$ is a hydrogen atom, a $C_{1-20}$ linear, branched or cyclic alkyl group, a $C_{1-20}$ alkoxy alkyl group or a $C_{1-16}$ linear, branched or cyclic alkoxy group. Ar is a $C_{2-30}$ heteroaromatic structure comprising at least one electron-withdrawing imine nitrogen in the heteroaromatic structure or a thiophene-arylene comprising the $C_{2-30}$ heteroaromatic structure. Typically, n, the number of repeat units in the copolymer, is an integer from 4 to 200.

The heteroaromatic structure in Ar of Eq. 6 is selected from the group consisting of a 5-membered heterocycle and a fused heterocycle. Examples of suitable five-membered heterocycles include thiazole, thiadiazole, oxazole, isooxazole, oxadiazole, imidazole, pyrazole, triazole, and tetrazole. Examples of fused heterocycles include quinoline, isoquinoline, quinoxaline, naphthridine, benzoimidazole, pyridopyrimidine, benzothiazole, benzothiadiazole, benzotriazole, benzooxazole, phenanthridine, phenanthroline, and phenazine. Furthermore, heteroaromatic structures may be selected from the group consisting of pyridazine, pyrimidine, pyrazine, and triazine.

Figure 2:
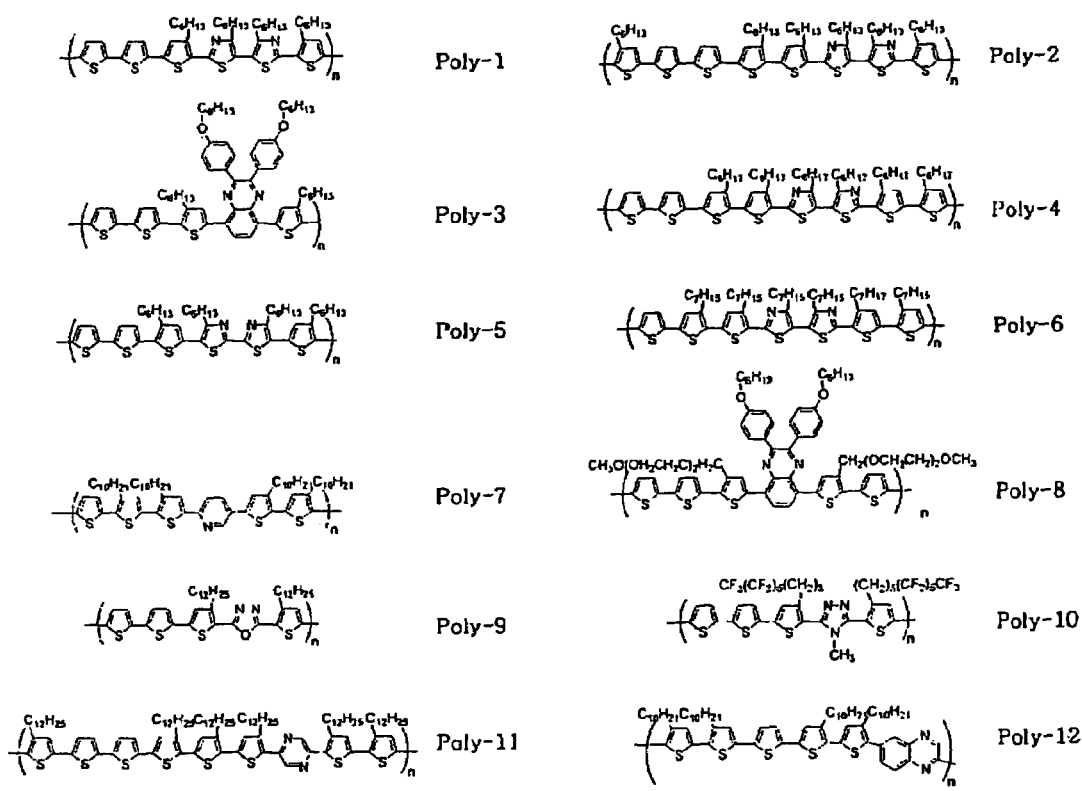
FIG. 2 illustrates example chemical structures for organic semiconductor copolymers that follow the generalized chemical structure of FIG. 1.

FIG. 2 illustrates example chemical structures for organic semiconductor copolymers consistent with exemplary embodiments disclosed herein. In FIG. 2, twelve example chemical structures are shown labeled as Poly-1 to Poly-12. Each of the example chemical structures in FIG. 2 follow the generic chemical structure of FIG. 1 as disclosed herein.

An exemplary method of preparing a poly(oligothiophene-arylene) derivative comprises adding a catalyst selected from the group consisting of Pd complexes and Ni complexes to a monomer solution. The monomer solution includes a first monomer containing a thiophene repeat unit along the main chain and a second monomer including an arylene along the main chain. The method further comprises preparing the poly(oligothiophene-arylene) derivative by a polycondensation reaction.

The first monomer 120 for the monomer solution is shown in FIG. 3A. In the 3A exemplary embodiment, a thiophene repeat unit 122 is positioned along the backbone chain and is functionalized at a first end by structure $A^1$ with a halogen atom, a trialkyltin group or a borane group. The first monomer 120 is also functionalized at a second end by structure $A^2$, which is a halogen atom, a trialkyltin group or a borane group. In the first monomer 120, the selection of structure $A^2$ may be the same or independent of the selection of structure $A^1$. $R^1$ in the chemical structure illustrated in FIG. 3A represents a hydrogen atom, a $C_{1-20}$ linear, branched or cyclic alkyl group, a $C_{1-20}$ alkoxy alkyl group or a $C_{1-16}$ linear, branched or cyclic alkoxy group. The number of repeat units, represented by a, is from 1 to 10.

The second monomer, or arylene monomer, is a $C_{2-30}$ heteroaromatic structure comprising at least one electron-withdrawing imine nitrogen atom in the heteroaromatic structure or an oliogoarylene comprising the $C_{2-30}$ heteroaromatic structure. An exemplary generic structure for this second monomer 124 is shown in FIG. 3B. $Ar^1$ represents the arylene, which is present in from 1 to 4 repeat units (represented by b). At a first end, the second monomer 124 of FIG. 3B is functionalized with a halogen atom or a trialkyltin group ($A^3$). At a second end, the second monomer 124 in FIG. 3B is also functionalized independently with a halogen item or a trialkyltin group ($A^4$). In the second monomer 124, the selection of structure $A^2$ may be the same or independent of the selection of structure $A^1$.

In a preferred embodiment, the oligoarylene comprises a $C_{2-30}$ heteroaromatic structure. A generic formula for this oligoarylene 130 is shown in FIG. 3C. In the FIG. 3C chemical structure, $Ar^1$ is a $C_{2-30}$ heteroaromatic structure comprising at least one electron withdrawing imine nitrogen atom in the heteroaromatic structure. $A^3$ and $A^4$ are the same as that described for the FIG. 3B chemical structure.

On either end of the oligoarylene 130 of FIG. 3C is a thiophene-based moiety 140, 140'. In one exemplary embodiment, a first thiophene moiety 140 has an integer number of repeat units where the integer is from 1 to 8, e.g., c=1 to 8, and the second thiophene moiety 140' has an integer number of repeat units where the integer is from 1 to 8, e.g., e=1 to 8, and the number of arylene repeat units is from 1 to 4, e.g., d=1 to 4. The first thiophene moiety 140 and the second thiophene moiety 140' are independently functionalized, represented by $R^2$ and $R^3$, respectively. $R^2$ is preferably a hydrogen atom, a hydroxyl group, a $C_{1-20}$ linear, branched or cyclic alkyl group, a $C_{1-20}$ alkoxyalkyl group, or a $C_{1-16}$ linear, branched or cyclic alkoxy group. $R^3$ is independently a hydrogen atom, a hydroxyl group, a $C_{1-20}$ linear, branched or cyclic alkyl group, a $C_{1-20}$ alkoxyalkyl group or a $C_{1-16}$ linear, branched or cyclic alkoxy group. In preferred embodiments, the functionalization of the first thiophene moiety 140 and the second thiophene moiety 140' are, amongst a plurality of the number of repeat units of first thiophene moiety and second thiophene moiety, the same.

Figure 4A:
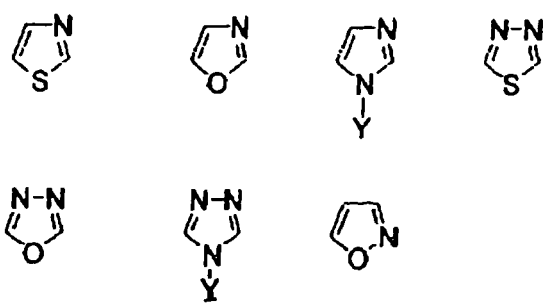
Figure 4B:
Figure 4C:
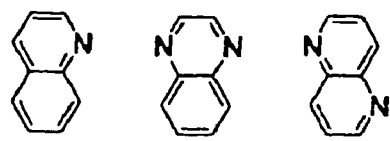
Figure 4C:
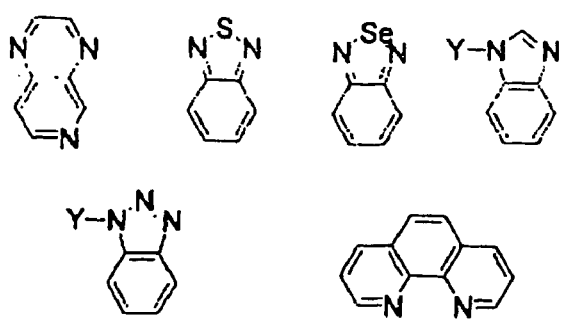

Example first monomers and second monomers for synthesis by the methods disclosed herein are presented in FIGS. 4A-4C. FIG. 4A shows example 5-member heterocycles. FIG. 4B shows example 6-member heterocycles. FIG. 4C shows example fused heterocycles. In addition, where the second monomer for the synthesis includes a thiophene-arylene comprising the $C_{2-30}$ heteroaromatic structure, examples of oligothiophene derivatives suitable for use in the starting monomer are shown in FIG. 5. This figure includes both 5-membered rings containing a nitrogen as well as fused members containing nitrogen.

In a preferred embodiment, the method prepares the organic semiconductor polymer by an organometallic polycondensation reaction. FIG. 6 shows an example of an embodiment of the method disclosed herein. In the exemplary method 200, a bromated arylene 202 (here corresponding to the second monomer), forms a mixture with at least one of a first type monomer 204. As shown in FIG. 6, the first type monomer 204 includes a thiophene repeat unit with a halogen atom, a trialkyltin group or a borane group affixed to a first end and/or a second end. Depending upon the beginning and ending group of the thiophene chain, either a palladium-based catalyst or nickel-based catalyst 206 is added to the mixture. For example, palladium-based catalyst typically is used for the coupling reaction between a halo-arylene and an arylene-trialkylstannane (or -borate; nickel-based catalys typically is used for the coupling reaction of halo-arylenes).

As shown in FIG. 6, multiple synthesis routes 208, 210, 212, 214 are available to produce the product organic semiconductor polymer 216. In a first polymerization method 208, Stille coupling using a palladium-based catalyst with thiophene-distannane is used. In this procedure, a mixture of equal molar equivalents of dibromo-arylene and thiophene-distannane is formed in anhydrous N,N'-dimethylformamide (DMF) under a nitrogen atmosphere. The DMF is added to about 5 to 10 mole percent of tetrakis(triphenylphosphine)palladium (Pd(PPh$_3$)$_4$). The mixture is stirred at 80° C. for 6 to 12 hours. After cooling, the reaction mixture is filtered and washed with a mixture of dilute aqueous hydrochloric acid in chloroform (NH$_4$OH(aq)/CHCl$_3$, and H$_2$O/CHCl$_3$, continuously for about one day. The isolated polymer is filtered by Soxhlet-extraction with methanol, acetone, and chloroform, in the stated order.

In a second procedure 210, Suzuki coupling using Pd(PPh$_3$)$_4$ with thiophene-diboronate is used. In this procedure, a mixture of equal molar equivalents of dibromo-arylene and thiophene-boronate in toluene is prepared under nitrogen atmosphere. Into this mixture, about 2 to 10 mole percent of Pd(PPh$_3$)$_4$ and about 1 molar aqueous solution of an inorganic base, e.g., about 5 to 10 molar equivalents, such as sodium bicarbonate and potassium bicarbonate, and about 1 to 5 mole percent of a phase transfer catalyst, such as tetrabutylammonium chloride, is added and the reaction mixture is then stirred at about 80° C. for 6 to 48 hours. The reaction mixture is poured into a mixture of dilute aqueous hydrochloric acid and methanol to precipitate the polymer. Obtained polymer is washed with a mixture of dilute aqueous hydrochloric acid and chloroform, continuously for about one day. The isolated polymer is Soxhlet-extracted with methanol, acetone and chloroform, in the stated order.

A third synthesis method employs Grignard Metathesis (GRIM) 212 using a nickel-based catalyst with dibromo-thiophene. In a preferred example, the nickel-based catalyst is 1,3-Bis(diphenylphosphinoprophane)]dichloro nickel (II) (Ni(dppp)Cl$_2$). In this method, 1.1 molar equivalents of Grignard reagent (1.0 M solution in diethylether, such as dodecylmagnesiumbromide) is added to a solution of 1.0 molar equivalent of dibromothiophene in anhydrous tetrahydrofurane (THF) at room temperature to form a reaction mixture. The reaction mixture is kept under inert atmosphere. At this point in the procedure, the reaction mixture is a 0.17 M solution against all starting materials having halogen atoms, for example dihalo-arylene. The reaction mixture is stirred for 1 to 2 hours at room temperature. A 1.0 M equivalent of dibromo-arylene and about 0.5 to 10 M percent of a nickel-based catalyst, such as Ni(dppp)Cl$_2$, is added to the reaction mixture. The reaction mixture is refluxed for about 3 to 6 hours. After that, the reaction mixture is poured into a mixture of dilute aqueous hydrochloric acid and methanol to precipitate the polymer. Obtained polymer is washed with a mixture of dilute aqueous hydrochloric acid in chloroform, continuously for about one day. The isolated polymer is Soxhlet-extracted with methanol, acetone and chloroform, in the stated order.

In a fourth embodiment of the disclosed method to form an organic semiconducting polymer, Yamamoto coupling using a nickel based catalyst with dibromo-thiophene is used 214. In an example of this procedure, a mixture of about 1.5 to 2 molar equivalents of zerovalent nickel complex (Ni(0) Lm), e.g. bis(1,5-cyclooctadiene)nickel(0) Ni(cod)$_2$, and equal molar neutral ligand (L), e.g. 2,2'-bipyridiyl (bpy), is stirred in the presence of excess amount of 1,5-cylcooctadiene (cod) in a reactor to form highly-active zerovalent nickel complex, Ni(cod)(bpy). Further details can be found in T. Yamamoto, et al., *J. Am. Chem. Soc.*, 1994, Vol. 116, p. 4832-4845, the entire contents of which are incorporated by reference. Also present is one molar equivalent of each of dibromo-thiophene and dibromo-arylene in anhydrous DMF. Stirring continues for about 6 to 12 hours at about 60° C. to 80° C. This procedure results in precipitation of the polymer. The reaction polymer is then washed with a mixture of dilute aqueous hydrochloric acid and chloroform continuously for about one day. The isolated polymer is then Soxhlet-extracted with methylene, acetone and chloroform, in the stated order.

FIG. 7 shows an example monomer synthesis 240 forming a 2,2'-Bis(5-bromo-2-thienyl)-5,5'-bithiazole derivative. In the example shown in FIG. 7, compound 1 is a 2-thienylthiazole derivative, compound 2 is a 2-thienyl-5-bromothiazole derivative, and compound 3 is a 2,2'-Bis(2-thienyl)-5,5'-bithiazole derivative. Details of the synthesis of this monomer follow.

Compound 1-2-thienyl-thiazole derivative: Compound 1 is prepared in general agreement with the method reported in the literature. See for example, Dane Goff et al., *Tetrahedron Letters*, Vol. 40, p. 423-426, (1999). In the case of 4,3'-Dihexyl-(2'-thienyl)-2-thiazole, the synthetic method began by dissolving 2-Cyano-3-hexylthiophene (10.0 g, 51.2 mmol) and Diethylamine (0.4 ml, 4.0 mmol) in DMF (N,N'-Dimethylforamide, 100 mL). At about −80° C., bubbling using $H_2S$ gas is bubbled through the mixture for about 1 hour to form a crude intermediate. The crude intermediate (ca. 45 mmol) is then mixed with 1-bromo-2-octanone (9.7 g, 50 mmol) in DMF(100 mL) to form a mixture and the mixture is refluxed for about twelve hours. After reaction, the cooled mixture is washed with a mixture of water and chloroform. Column chromatography in a $SiO_2$-column using an eluent of hexane/ethyl acetate in a ratio of 20 to1 results in the product compound 1. In exemplary embodiments, this reaction has a yield of about 26%. Proton NMR data in $CDCl_3$ for compound 1 includes δ (ppm) 0.88 (6H), 1.32 (12H), 1.68 (4H), 2.73 (2H), 2.83 (2H), 6.82 (1H) 6.92 (1H) and 7.25 (1H).

Compound 2-2-thienyl-5-bromothiazole derivative: In the exemplary monomer synthesis of FIG. 7, Compound 2 (2-thienyl-5-bromothiazole derivative) is formed in the following manner. A mixture of 17 grams, 95.7 mmol of N-Bromosuccinimide (NBS) and 13.1 grams, 95.7 mmol of compound 1 are stirred in 200 mL of chloromethane at room temperature for about 1 hour. The product recovered from the mixture is washed with a mixture of chloromethane and water and aqueous $NaHCO_3$. Column chromatography in a $SiO_2$-column using an eluent of hexane/ethyl acetate in a ratio of 90 to 1 gives a product in the form of a brown liquid. In exemplary embodiments, this reaction yields 25.1 grams at a yield of 63%. Proton NMR data in $CDCl_3$ for compound 2 includes δ (ppm) 0.89 (6H), 1.35 (12H), 1.68 (4H), 2.73 (2H), 2.83 (2H), 6.92 (1H) and 7.26 (1H).

Compound 3-2,2'-Bis(2-thienyl)-5,5'-bithiazole derivative: Compound 3 of FIG. 7 is formed in the following manner. Under a nitrogen atmosphere, compound 2 (1.77 grams, 4.28 mmol) is added to a mixture of about 1.5 molar equivalents of zerovalent nickel complex (Ni(0)Lm 1:1 mixture of $Ni(cod)_2$ (1.9 grams) and 2,2'-bipyridiyl (bpy) (1.08 grams) and an excess amount of 1,5-cyclooctadiene (cod) (1 gram) in anhydrous DMF (40 mL). The mixture is stirred at about 80° C. for about 12 to 24 hours. Recovered product is washed with a mixture of aqueous hydrochloric acid and $CHCl_3$ and water. Column chromatography in a $SiO_2$-column with an eluent of hexane/ethyl acetate at 8 to 2 ratio gives a product in the form of a red solid. Exemplary synthesis produced 1.13 grams at a yield of 79%. Proton NMR data in $CDCl_3$ for this product includes δ (ppm) 0.88 (6H), 1.29 (10H), 1.33 (2H), 1.70 (4H), 2.69 (2H), 2.92 (2H), 6.97 (1H), and 7.29 (1H).

Compound 4-2,2'-Bis(5-bromo-2-thienyl)-5,5'-bithiazole derivative: Compound 4 is formed in the following synthesis. A mixture of NBS (1.01 grams, 5.7 mmol) and compound 3 are stirred in a mixture of chloroform and acetic acid having a ratio of 30 to 10 by volume at about 25° C. for one hour. The recovered product is washed with a mixture of aqueous $NaHCO_3$ and water. Column chromatography in a $SiO_2$-column with an eluent of hexane/ethyl acetate at a ratio of 8 to 2 gives a product in the form of a yellow solid. In exemplary embodiments, 1.3 grams of product was recovered at a yield of 58 percent. Proton NMR data in $CDCl_3$ for compound 4 is shown in FIG. 8A and includes δ (ppm) 0.88 (6H), 1.31 (12H), 1.68 (4H), 2.65 (2H), 2.83 (2H), and 6.92 (1H).

An exemplary embodiment of a polymer synthesis follows. This exemplary embodiment synthesizes Poly-1, the chemical structure of which is shown in FIG. 2. Exemplary synthesis for Poly-1 includes mixing compound 4 derivatives from the above disclosed synthesis method for monomers and 5,5'-bis(trimethyltin)-2,2'-bithiophene in anhydrous DMF. In one specific embodiment, 1.0 grams, 1.21 mmol of compound 4 and 0.6 grams, 1.21 mmol of 5,5'-bis(trimethyltin)-2,2'-bithiophene was mixed with 30 mL of DMF under nitrogen atmosphere. To this mixture, about 10 mole percent of a palladium catalyst such as $Pd(PPh_3)_4$ is added. After stirring at 80° C. for about 12 hours, the mixture is cooled to room temperature. The product is recovered by filtering and washing with a mixture of dilute aqueous hydrochloric acid and chloroform, continuously for about one day. The isolated polymer is filtered by Soxhlet-extraction with methanol, acetone, chloroform, in the stated order. Removal of the solvent and drying recovers a dark red polymer. In the specific example disclosed above, 200 mg of product was recovered at a yield of 20 percent. Proton NMR in $CDCl_3$ of this product is shown n FIG. 8B and includes δ (ppm) 0.92 (12H), 1.30 (20H), 1.44 (4H), 1.74 (8H), 2.72 (4H), 2.87 (4H), 7.05 (2H), 7.12 (2H) and 7.18 (2H). In a second polymer synthesis, Poly-2 was formed. Proton NMR in $CDCl_3$ for poly-2 is shown in FIG. 8C and includes δ (ppm) 0.90 (18H), 1.34 (28H), 1.43 (8H), 1.74 (12H), 2.71 (4H), 2.81 (4H), 2.91 (4H), 7.02 (4H) and 7.09 (4H).

An exemplary embodiment of a semiconductor multilayer structure is presented in FIG. 9. Exemplary embodiments of a multilayer structure 300 comprise a substrate 302, a gate 304 deposited on the substrate 302, a source 306 and a drain 308. The source 306 and the drain 308 are separated from the gate 304 by an insulator 310. A channel layer 312 is formed in the device of an organic semiconductor polymer. Any organic semiconductor polymer consistent with the organic semiconductor polymers disclosed herein are suitable for use as a channel layer. In a specific exemplary embodiment, the semiconductor multilayer structure is a p-channel organic thin film transistor.

An exemplary method to fabricate a semiconductor multilayer structure is as follows. Chromium is deposited onto a washed glass substrate to a thickness of 1000 Å by a sputtering process to form a gate electrode. $SiO_2$ is deposited onto the gate electrode to a thickness of 1000 Å by a chemical vapor deposition (CVD) process to form a gate insulating dielectric layer. A source-drain electrode, for example, indium-tin-oxide (ITO) was deposited onto the gate insulating layer to a thickness of 1200 Å by a sputtering process. The resulting structure was washed with isopropyl alcohol for 10 minutes and dried. The dried structure was then dipped in a 10 mM octadecyltrichlorosilane solution in chloroform for 30 seconds followed by washing with acetone and drying. Subsequently, a channel layer material was deposited on the structure.

Any suitable solution processing technique can be utilized for depositing the channel layer. Exemplary embodiments of the disclosed organic semiconductors have high solubility, e.g., at least 1 and up to 2 to 3 weight percent (wt. %) in common organic solvents, such as chloroform, chlorobenzene, toluene, tetrahydrofuran, xylene and the like. Further, the high solubility of the disclosed organic semiconductors contribute to improved fabrication methods of electronic and semiconductor devices including the use of solution process techniques, such as spin coating, dip coating, screen printing, jet printing, and so forth.

In a specific exemplary embodiment, semiconducting polymer chloroform solution in a concentration of 1 wt % is applied on the formed substrate/source, drain/gate structure by spin coating. Spin coating occurred at 1000 rpm and the resulting solution formed a thickness of about 1000 Å. The entire structure was then baked under an inert atmosphere at 100° C. for 1 hour resulting in a fabricated organic thin film transistor device as shown in FIG. 9.

Comparative Testing. Organic thin film transistor devices utilizing Poly-1, Poly-2, and Poly-3, as shown in FIG. 2, were formed and tested against an organic thin film transistor device utilizing a known material for the channel layer, e.g., HT-P3HT. Devices for the comparative example were fabricated as bottom contact devices utilizing a gate electrode of gold, a source and drain electrode of a conducting material, e.g., gold, polysilicon, silver, copper and so forth, a gate dielectric layer of organic polymer film and having a channel width of 1000 μm and a channel length of 100 μm. Spin coated film using 1 wt % of $CHCl_3$ solution were baked at 80° C. for 12 hours before evaluation. The device evaluation utilized the semiconductor characterization system described herein with a sweeping range of gate voltage of from minus 60 volts to approximately plus 20 volts. Alternatively, for forming the spin coated film, chloroform or chlorobenzene solution can be used at 1 wt %.

FIGS. 10A to 10C show the source and drain current characteristics of organic thin film transistors utilizing Poly-1, Poly-2, and Poly-3, respectively.

Embodiments of devices disclosed herein were evaluated for mobility. Charge mobility was calculated from current-transfer curves of devices plotted using a Semiconductor Characterization System (4200-SCS available from Keithley Corp.). The following current equation was evaluated in the saturation region:

$$I_{SD} = \frac{WC_o}{2L}\mu_{FET}(V_G - V_T)^2 \qquad (Eq.\ 7)$$

Where $I_{SD}$ is source-drain current, $\mu_{FET}$ is charge mobility, $C_o$ is capacitance of the insulating layer, W is channel width, L is channel length, $V_G$ is gate voltage and $V_T$ is threshold voltage.

Table 1 summarizes results for mobility, on/off ratios, and off-state currents for the three inventive devices and the comparative example. As can be seen from the results presented in Table 1, the inventive samples had a mobility, an on:off ratio, and an off-state current, of from 1 to 3 orders of magnitude improved over that of the device using the HT-P3HT material.

Comparative example (Table 1)

| Material for channel layer | Mobility (cm²/Vs) | On:off ratio | Off state current (A) |
| --- | --- | --- | --- |
| Poly-1 | 0.007 to 0.018 | 6000 | $1 \times 10^{-11}$ |
| Poly-2 | 0.1 | 70000 | $6 \times 10^{-11}$ |
| Poly-3 | 0.01 to 0.03 | 10000 | $1 \times 10^{-11}$ |
| HT-P3HT* | 0.0008 | 400 | $1 \times 10^{-9}$ |

*comparative example: Regioregular HT-poly(3-hexylthiophene-2,5-diyl) commercially available from Aldrich Co.

Although the present invention has been described in connection with preferred embodiments thereof, it will be appreciated by those skilled in the art that additions, deletions, modifications, and substitutions not specifically described may be made without department from the spirit and scope of the invention as defined in the appended claims.

What is claimed is:

1. An organic semiconductor copolymer comprising:
   a poly(oligothiophene-arylene) derivative having a chemical formula:

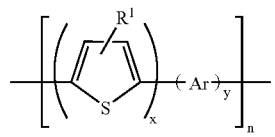

wherein
   x is an integer from 3 to 12,
   y is an integer from 1 to 4 with x>y,
   $R^1$ is a hydrogen atom, a $C_{1-20}$ linear, branched, or cyclic alkyl group, a $C_{1-20}$ alkoxyalkyl group or a $C_{1-16}$ linear, branched, or cyclic alkoxy group,
   Ar is a $C_{2-30}$ heteroaromatic structure comprising at least one electron-withdrawing imine nitrogen atom in the heteroaromatic structure or a thiophene-arylene comprising the $C_{2-30}$ heteroaromatic structure, and
   n is an integer from 4 to 200.

2. The organic semiconductor copolymer of claim 1, wherein the heteroaromatic structure in Ar is selected from the group consisting of a 5-membered heterocycle and a fused heterocycle.

3. The organic semiconductor copolymer of claim 2, wherein the 5-membered heterocycle is selected from the group consisting of thiazole, thiadiazole, oxazole, isooxazole, oxadiazole, imidazole, pyrazole, triazole, and tetrazole.

4. The organic semiconductor copolymer of claim 2, wherein the fused heterocycle is selected from the group consisting of quinoline, isoquinoline, quinoxaline, naphthridine, benzoimidazole, pyridopyrimidine, benzothiazole, benzothiadiazole, benzotriazole, benzooxazole, phenanthridine, phenanthroline, and phenazine.

5. The organic semiconductor copolymer of claim 1, wherein the heteroaromatic structure in Ar is selected from the group consisting of pyridazine, pyrimidine, pyrazine, and triazine.

6. The organic semiconductor copolymer of claim 1, wherein the heteroaromatic structure in Ar is bipyridine.

7. The organic semiconductor copolymer of claim 1, wherein y is an even integer.

8. The organic semiconductor copolymer of claim 7, wherein y is 4.

* * * * *